United States Patent [19]
Smith et al.

[11] Patent Number: 6,048,804
[45] Date of Patent: Apr. 11, 2000

[54] PROCESS FOR PRODUCING NANOPOROUS SILICA THIN FILMS

[75] Inventors: Douglas M. Smith; Teresa Ramos; Kevin H. Roderick; Stephen Wallace, all of Albuquerque, N.Mex.

[73] Assignee: AlliedSignal Inc., Morristown, N.J.

[21] Appl. No.: 09/054,262

[22] Filed: Apr. 3, 1998

Related U.S. Application Data

[60] Provisional application No. 60/044,402, Apr. 29, 1997.

[51] Int. Cl.[7] .................................................. H01L 21/208
[52] U.S. Cl. .......................... 438/790; 438/787; 438/781; 438/782; 438/624
[58] Field of Search .................................... 438/787, 781, 438/782, 790, 624

[56] References Cited

U.S. PATENT DOCUMENTS 5,736,425  4/1998  Smith et al. ............................ 438/778

FOREIGN PATENT DOCUMENTS

| 0461782 | 12/1991 | European Pat. Off. . |
| 0687004 | 12/1995 | European Pat. Off. . |
| 0775669 | 5/1997 | European Pat. Off. . |
| WO 92 03378 | 3/1992 | WIPO . |

*Primary Examiner*—Charles Bowers
*Assistant Examiner*—Renzo Rocchegiani
*Attorney, Agent, or Firm*—Leslie A. Weise; Roger H. Criss

[57] ABSTRACT

A process for forming a nanoporous dielectric coating on a substrate. The process follows the steps of blending an alkoxysilane with a solvent composition and optional water; depositing the mixture onto a substrate while evaporating at least a portion of the solvent composition; placing the substrate in a sealed chamber and evacuating the chamber to a pressure below atmospheric pressure; exposing the substrate to water vapor at a pressure below atmospheric pressure and then exposing the substrate to base vapor.

21 Claims, 1 Drawing Sheet

PROCESS FOR PRODUCING NANOPOROUS SILICA THIN FILMS

CROSS REFERENCE TO RELATED APPLICATION

This application claims the benefit of provisional application 60/044,402 filed Apr. 29, 1997 which is incorporated herein by reference.

BACKGROUND OF THE INVENTION

1. Field of the Invention

The invention relates to nanoporous dielectric films and to a process for their manufacture. Such films are useful in the production of integrated circuits.

2. Description of the Prior Art

In the production of integrated circuits, the problems of interconnect RC delay, power consumption and crosstalk become more significant as feature sizes approach 0.25 µm and below. The use of low dielectric constant (K) materials for interlevel dielectric and intermetal dielectric applications partially mitigate these problems. However, each of the material candidates which are under consideration by the industry, having dielectric constants significantly lower than the currently employed dense silica, suffer from disadvantages. Most low dielectric constant materials developments use spin-on-glasses and fluorinated plasma chemical vapor disposition $SiO_2$ with K of >3. Some organic and inorganic polymers have dielectric constants in the range of about 2.2 to 3.5, however, these have the problems of low thermal stability, poor mechanical properties including low glass transition temperature, sample outgassing, and long term reliability questions.

Another approach has been to employ nanoporous silica which can have dielectric constants in the range of about 1 to 3. Porous silica is attractive because it employs similar precursors, e.g. tetraethoxysilane (TEOS) as is presently used for spun-on glass (SOG's) and CVD $SiO_2$, and due to the ability to carefully control pore size and pore distribution. In addition to having low dielectric constants, nanoporous silica offers other advantages for microelectronics including thermal stability up to 900° C.; small pore size (<<microelectronics features), use of materials, namely silica and its precursors, that are widely used in the semiconductor industry; the ability to tune dielectric constant over a wide range; and deposition using similar tools as employed for conventional spun-on glass processing. EP patent application EP 0 775 669 A2, which is incorporated herein by reference, shows a one method for producing a nanoporous silica film with uniform density throughout the film thickness.

Higher porosity materials not only leads to a lower dielectric constant than dense materials, but such also allow additional components and processing steps to be introduced. Materials issues include, the need for having all pores significantly smaller than circuit feature sizes; the strength decrease associated with porosity; and the role of surface chemistry on dielectric constant, loss and environmental stability. Density, or its inverse, porosity, is the key nanoporous silica parameter controlling property of importance for dielectrics. Properties may be varied over a continuous spectrum from the extremes of an air gap at a porosity of 100% to dense silica with a porosity of 0%. As density increases, dielectric constant and mechanical strength increase but the pore size decreases.

Nanoporous silica films are fabricated by using a mixture of a solvent and a silica precursor which is deposited on a wafer by conventional methods such as spin-coating, dip-coating, etc. The precursor must polymerize after deposition and be sufficiently strong such that it does not shrink during drying. Film thickness and density/dielectric constant can be controlled independently by using a mixture of two solvents with different volatility. The solvent evaporates during and immediately after precursor deposition. The silica precursor, typically a partially hydrolyzed and condensed product of TEOS, is polymerized by chemical and/or thermal means until it forms a gel layer. Using this approach, a nanoporous silica film is obtained with uniform density throughout the film thickness.

Normally in sol-gel processing to produce porous silica, a liquid catalyst such as an acid or base is added to the silica precursor/solvent mixture in order to initiate polymerization. This catalyst addition is often accompanied by the addition of water which is a reactant in the silane hydrolysis and condensation reactions which result in polymerization. For semiconductors processing, the requirement of premixing the catalyst with the precursor poses severe problems because relatively small quantities of catalyst and precursor, less than 5 milliliters total, must be very accurately measured and mixed since deposition is conducted one wafer at a time. The viscosity of the fluids start to change after catalyst addition which requires that deposition, which is a strong function of viscosity to achieve the same film thickness, must be carefully timed from catalyst addition to deposition. A catalyst/precursor solution which is not deposited at the correct time cannot be reused, leading to excessive waste.

In order to avoid these problems, a deposited precursor film is sequentially contacted with a water vapor and then a base vapor in either order to initiate polymerization. Previous investigators have contacted a carrier gas such as nitrogen with a base-water mixture such as ammonium hydroxide and passed the gas/vapor mixture by the wafer covered with the precursor film. Although avoiding the liquid-liquid mixing and deposition timing problems outlined above, this approach has the problems of maintaining constant ammonia and water partial pressures in the carrier stream; measuring the actual ammonia and water vapor concentrations in the carrier gas stream; relatively high flow rates are required to minimize reaction times; and disposal of large quantities of carrier gas containing ammonia. Another suggested approach has been to place the wafer with the precursor film in a sealed chamber and inject a base/water solution such as ammonium hydroxide into the chamber. This approach avoids some of the problems outlined above, but still does not allow measurement of the base and water concentration in the atmosphere and requires long reaction times because of gas phase mixing constraints in the atmosphere above the wafer.

The present invention solves these problems by conducting a series of processing steps which enable the production of nanoporous silica thin films with minimum process time, minimum base catalyst use, and with greater film uniformity of thickness and refractive index.

SUMMARY OF THE INVENTION

The invention provides a process for forming a nanoporous dielectric coating on a substrate which comprises (a) blending at least one alkoxysilane with a solvent composition and optional water, thus forming a mixture and causing a partial hydrolysis and partial condensation of the alkoxysilane;

(b) depositing the mixture onto a substrate while evaporating at least a portion of the solvent composition;

(c) placing the substrate in a sealed chamber and evacuating the chamber to a pressure below atmospheric pressure; then sequentially (d) exposing the substrate either to water vapor or to a base vapor, at a pressure below atmospheric pressure; then (e) exposing the substrate to water vapor if the substrate is exposed to a base vapor in step (d), or to a base vapor if the substrate is exposed to water vapor in step (d).

The invention also provides a semiconductor device produced by a process which comprises (a) blending at least one alkoxysilane with a solvent composition and optional water, thus forming a mixture and causing a partial hydrolysis and partial condensation of the alkoxysilane;

(b) depositing the mixture onto a semiconductor substrate while evaporating at least a portion of the solvent composition;

(c) placing the semiconductor substrate in a sealed chamber and evacuating the chamber to a pressure below atmospheric pressure; then sequentially (d) exposing the semiconductor substrate either to water vapor or to a base vapor, at a pressure below atmospheric pressure; then (e) exposing the semiconductor substrate to water vapor if the substrate is exposed to a base vapor in step (d), or to a base vapor if the substrate is exposed to water vapor in step (d), this forming a nanoporous dielectric silicon coating on the semiconductor substrate.

By means of this invention, the space around the wafer containing the nanoporous silica precursor is evacuated followed by sequential addition of water vapor and base vapor. The pressure increase after the addition of each component is a direct measure of the partial pressure of that component. Since the ambient atmosphere has been evacuated before water and base vapor addition, mixing problems are minimized resulting in reduced thin film processing times.

DETAILED DESCRIPTION OF THE PREFERRED EMBODIMENT

Figure 1:
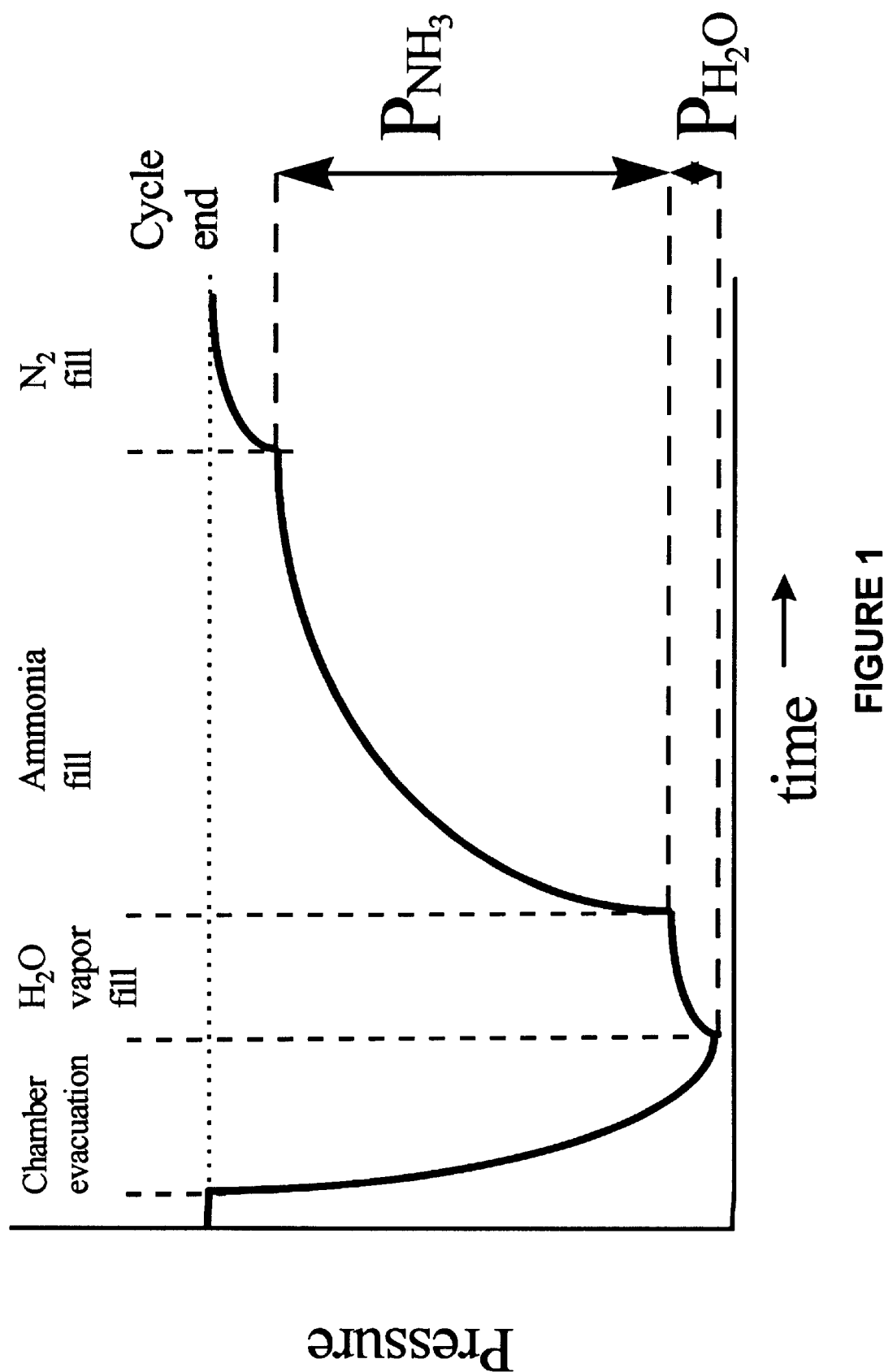
FIG. 1 is a graph of reaction chamber pressure history during film processing according to this invention.

The first step of the inventive process forms a reaction product of at least one alkoxysilane, a solvent composition, optional water and an optional catalytic amount of an acid. Water is included to provide a medium for hydrolyzing the alkoxysilane.

Preferably the solvent composition comprises at least one a relatively high volatility solvent and at least one a relatively low volatility solvent.

This reaction product is applied onto a substrate, optionally having raised lines as described below. The high volatility solvent evaporates during and immediately after deposition of the reaction product. The reaction product is hydrolyzed and condensed until it forms a gel layer.

Useful alkoxysilanes for this invention include those which have the formula:

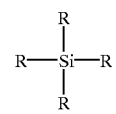

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

For purposes of this invention, a relatively high volatility solvent is one which evaporates at a temperature below, preferably significantly below that of the relatively low volatility solvent. The relatively high volatility solvent preferably has a boiling point of about 120° C. or less, preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

The relatively low volatility solvent composition is one which evaporates at a temperature above, preferably significantly above that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The optional acid serves to catalyze the reaction of the alkoxysilane with the relatively high volatility solvent, a relatively low volatility solvent and water. Suitable acids are nitric acid and compatible organic acids which are volatile, i.e. which evaporate from the resulting reaction product under the process operating conditions, and which do not introduce impurities into the reaction product.

The alkoxysilane component is preferably present in an amount of from about 3% to about 50% by weight of the overall blend. A more preferred range is from about 5% to about 45% and most preferably from about 10% to about 40%.

The solvent component is preferably present in an amount of from about 20% to about 90% by weight of the overall blend. A more preferred range is from about 30% to about 70% and most preferably from about 40% to about 60%. When both a high and a low volatility solvent are present, the high volatility solvent component is preferably present in an amount of from about 20% to about 90% by weight of the overall blend. A more preferred range is from about 30% to about 70% and most preferably from about 40% to about 60%. When both a high and a low volatility solvent are present, the low volatility solvent component is preferably present in an amount of from about 1 to about 40% by weight of the overall blend. A more preferred range is from about 3% to about 30% and most preferably from about 5% to about 20%.

The mole ratio of water to silane is preferably from about 0 to about 50. A more preferred range is from about 0.1 to about 10 and most preferably from about 0.5 to about 1.5. The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

The alkoxysilane containing composition is then coated on a substrate, optionally having a pattern of lines on its surface and forms a dielectric film on the surface. The layer is relatively uniformly applied. Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

The solvent, usually the higher volatility solvent is then at least partially evaporated. The more volatile solvent evaporates over a period of seconds or minutes. At this point, the film is a viscous liquid of the silica precursors and the less volatile solvent. Slightly elevated temperatures may optionally be employed to accelerate this step. Such temperatures may range from about 20° C. to about 80° C., preferably range from about 20° C. to about 50° C. and more range from about 20° C. to about 35° C.

The wafer is placed in a sealed chamber and is rapidly evacuated to a vacuum. In the preferred embodiment, the pressure of the evacuated chamber ranges from about 0.001 torr to about 0.1 torr. Then the coating is sequentially exposed to both a water vapor and a base vapor. For purposes of this invention, a base vapor includes gaseous bases. Preferably the coating is first exposed to a water vapor and then exposed to a base vapor, however, in an alternate embodiment, the coating may first be exposed to a base vapor and then a water vapor. The first of the two exposures is conducted such that thereafter the pressure in the chamber remains at sub-atmospheric pressure. The second exposure may be conducted at atmospheric pressure, sub-atmospheric pressure or super-atmospheric pressure.

In the preferred embodiment, after the wafer is placed in the sealed chamber and the chamber evacuated to a vacuum, a valve is opened to a reservoir of water, and water vapor quickly fills the chamber. The partial pressure of water vapor, $P_{H2O}$ is controlled by the length of time that the valve is open and the temperature at which the liquid water reservoir is maintained. Because of the low vapor pressure of water, the chamber pressure after water addition is much less than ambient. The pressure rise that occurs in the chamber during the water vapor addition is a direct measure of the water vapor partial pressure. In the preferred embodiment, the pressure of the evacuated chamber after the water vapor exposure ranges from about 0.1 torr to about 150 torr, preferably about 1 torr to about 40 torr and more preferably from about 5 torr to about 20 torr. In the preferred embodiment, the temperature of the water during the exposure ranges from about 10° C. to about 60° C., preferably from about 15° C. to about 50° C., and more preferably from about 20° C. to about 40° C. In the preferred embodiment, the temperature in the chamber after water exposure ranges from about 10° C. to about 50° C., preferably from about 15° C. to about 40° C., and more preferably from about 20° C. to about 40° C.

After water vapor addition, a base vapor is dosed into the chamber. The chamber pressure after base dosing may be at, above or below atmospheric pressure. If the pressure is above atmospheric, the chamber must be designed to resist the total system pressure. As with water vapor, the partial pressure of the base is known directly from the pressure rise during base dosing. Because the chamber only contains base and water vapor, except for trace amounts of atmospheric gas left from the initial chamber pumpdown, the base and water diffusion rates are much faster than the case when evacuation is not conducted, resulting in greatly increased polymerization rates, decreased process time per wafer, and greater uniformity across the wafer. Since the base and water vapor are added separately, their partial pressures are easily measured and there is very little waste. Only the vapor above the wafer need be removed upon deposition. The order of addition of water and base may be reversed but the addition of water before the base is preferred because of its lower vapor pressure. In the preferred embodiment, the pressure of the evacuated chamber after the base vapor exposure ranges from about 100 torr to about 2,000 torr, preferably about 400 torr to about 1,000 torr and more preferably from about 600 torr to about 800 torr. In the preferred embodiment, the temperature of the base during the exposure ranges from about 10° C. to about 60° C., preferably from about 15°C to about 40° C., and more preferably from about 20° C. to about 30° C. In the preferred embodiment, the temperature in the chamber after base exposure ranges from about 10° C. to about 50° C., preferably from about 15° C. to about 40° C., and more preferably from about 20° C. to about 40° C.

Suitable bases for use in the base vapor nonexclusively include ammonia and amines, such as primary, secondary and tertiary alkyl amines, aryl amines, alcohol amines and mixtures thereof which have a boiling point of about 200° C. or less, preferably 100° C. or less and more preferably 25° C. or less. Preferred amines are methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basicity constant $K_b$, and $pK_b = -\log K_b$. In the preferred embodiment, the $pK_b$ of the base may range from about less than 0 to about 9. A more preferred range is from about 2 to about 6 and most preferably from about 4 to about 5.

In the preferred embodiment, the mole ratio of water vapor to base vapor ranges from about 1:3 to about 1:100, preferably from about 1:5 to about 1:50, and more preferably from about 1:10 to about 1:30.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The film is then dried in a conventional way by solvent evaporation of the less volatile solvent. Elevated temperatures may be employed to dry the coating in this step. Such temperatures may range from about 20° C. to about 450° C., preferably from about 50° C. to about 350° C. and more preferably from about 175° C. to about 320° C.

After the desired time of reaction after base addition, on the order of seconds to a few minutes, the chamber pressure is brought to atmospheric pressure. This can be accomplished by either adding an inert gas such as nitrogen and opening the chamber or evacuating the base/water mixture via vacuum and backfilling with an inert gas. The invention is best understood by referring to FIG. 1. A precursor is deposited on a wafer and the more volatile solvent continues to evaporate over a period of seconds. The wafer is placed in a sealed chamber at ambient pressure. The chamber is opened to a vacuum source and the ambient gas is evacuated and the chamber pressure decreases. In the next step, water vapor is added and the chamber pressure increases.

The pressure increase during that step is the water partial pressure ($P_{H2O}$). The base vapor, in this case ammonia, is introduced into the chamber and polymerization is triggered. The pressure increase during this step is the base partial pressure (for example, $P_{NH3}$). After the desired time, the chamber pressure may be raised to ambient by filling with an inert gas, such as nitrogen as shown, or it may be first evacuated to vacuum and subsequently backfilled to ambient pressure.

As a result, a relatively high porosity, low dielectric constant, silicon containing polymer composition forms on the substrate. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 $g/cm^2$, more preferably from about 0.25 to about 1.6 $g/cm^2$, and most preferably from about 0.4 to about 1.2 $g/cm^2$.

The following nonlimiting examples serve to illustrate the invention.

EXAMPLE 1

This example illustrates a process wherein a precursor is spin deposited onto a silicon wafer, the wafer is then aged in a chamber for a given period and then dried. The aging process in the chamber is as follows. The chamber is evacuated, dosed with water vapor to various pressures for a fixed amount of time, dosed with ammonia gas to a higher pressure for a fixed amount of time, evacuated once again for a fixed time, then the pressure in the chamber is brought to ambient by backfilling with an inert gas. A precursor was made by mixing, while stirring, 61 ml tetraethyoxysilane, 61 ml tetraethylene glycol, 4.87 ml deionized water, and 0.2 ml 1M nitric acid (Conc. $HNO_3$ diluted to 1M. This mixture was then refluxed while stirring continuously for 1.5 hours, then cooled. A portion of this precursor was diluted 55% by weight with ethanol while stirring. Approximately 1.5 ml of this diluted precursor was deposited onto a 4 inch silicon wafer on a spin chuck, and spun on at 2500 rpm for 10 seconds. Two films were deposited in this way. Each film was placed into an aging chamber, which was evacuated to 1 mbar (0.76 torr) in 30 seconds. Water vapor was dosed into the chamber to 7 mbar (5.32 torr) (from a reservoir of deionized water at 0° C.) for the first wafer, and 14 mbar (10.64 torr) (from a reservoir of deionized water at 25° C.) for the second; the wafers were left for 30 seconds at these pressures. Ammonia gas was dosed into the chamber to a pressure of 855 mbar (649.8 torr) for the first wafer and 809 mbar (614.84 torr) for the second; the wafers were left for 1 minute at this pressure. The chamber was evacuated for 30 seconds to 2 mbar (1.52 torr), then immediately backfilled with air to ambient pressure. The films were placed on a hotplate at 90° C. for 2 minutes, followed by an oven bake at 175° C. for 3 minutes, then another oven bake at 400° C. for 3 minutes. The wafers were removed and after cooling were measured by Ellipsometry for thickness and refractive index. Refractive index can be linearly correlated to the film porosity. A refractive index of 1.0 is 100% porosity and 1.46 is dense, 0% porosity silica. The results of the measurements are shown on the table below.

| Pressure After Water Dose (mbar) (torr) | Pressure after Ammonia Dose (mbar) (torr) | Index of Refraction | Thickness Å |
|---|---|---|---|
| 7 (5.32) | 855 (649.8) | 1.257 | 2456 |
| 14 (10.64) | 809 (614.84) | 1.123 | 4850 |

EXAMPLE 2

This example illustrates a process wherein a precursor is spin deposited onto a silicon wafer, the wafer is aged in a chamber for a given period and dried. The aging process in the chamber is as follows. The chamber is evacuated, dosed with water vapor to a fixed pressure for a fixed amount of time, dosed with ammonia gas to a higher pressure for various amounts of time and evacuated once again for a fixed time. The pressure in the chamber is then brought to ambient by backfilling with an inert gas. A precursor was made by mixing, while stirring, 61 ml tetraethyoxysilane, 61 ml tetraethylene glycol, 4.87 ml deionized water, and 0.2 ml 1M nitric acid. This mixture was then refluxed while stirring continuously for 1.5 hours, then cooled. A portion of this precursor was then diluted 55% by weight with methanol while stirring. Approximately 1.5 ml of this diluted precursor was deposited onto a 4 inch silicon wafer on a spin chuck, and spun on at 2500 rpm for 10 seconds. Two films were deposited in such a way. Each film was placed into an aging chamber, which was evacuated to 1 mbar (0.76 torr) in 30 seconds. Water vapor was dosed into the chamber to 16 mbar (12.16 torr) (from a reservoir of deionized water at 25° C. ) and the wafers were left for 30 seconds at this pressure. Ammonia gas was dosed into the chamber to a pressure of 809 mbar (614.84 torr); The first wafer was left for 1 minute at this pressure, while the second was left for 3 minutes. The chamber was evacuated for 30 seconds to 2 mbar (1.52 torr), then immediately backfilled with air to ambient pressure. The films were then placed on a hotplate at 90° C. for 2 minutes, followed by an oven bake at 175° C. for 3 minutes, then another oven bake at 400° C. for 3 minutes. The wafers were then removed and after cooling were measured by Ellipsometry for thickness and refractive index. The results of the measurements are shown on the table below.

| Aging Time After NH₃ Dose (min) | Index of Refraction | Thickness Å |
| --- | --- | --- |
| 1 | 1.104 | 7150 |
| 3 | 1.085 | 8050 |

EXAMPLE 3

This example illustrates a process wherein a precursor is spin deposited onto a silicon wafer, the wafer is then aged in a chamber for a given period and then dried. The aging process in the chamber is as follows. The chamber is evacuated, dosed with water vapor to a fixed pressure for a fixed amount of time, dosed with ammonia gas to various higher pressures for a fixed amount of time, evacuated once again for a fixed time, then the pressure in the chamber is brought to ambient by backfilling with an inert gas. A precursor was made by mixing, while stirring, 61 ml tetraethyoxysilane, 61 ml tetraethylene glycol, 4.87 ml deionized water, and 0.2 ml 1M nitric acid. This mixture was then refluxed while stirring continuously for 1.5 hours, then cooled. A portion of this precursor was diluted 55% by weight with methanol while stirring. Approximately 1.5 ml of this diluted precursor was deposited onto a 4 inch silicon wafer on a spin chuck, and spun on at 2500 rpm for 10 seconds. Three films were deposited in such a way. Each film was placed into an aging chamber, which was evacuated to 1 mbar (0.76 torr) in 30 seconds. Water vapor was dosed into the chamber to 15 mbar (11.4 torr) (from a reservoir of deionized water at 25° C.) and the wafers were left for 30 seconds at this pressure. Ammonia gas was dosed into the chamber to a pressure of 270 mbar (205.2 torr) for the first wafer, 506 mbar (384.56 torr) for the second wafer, and 809 mbar (614.84 torr) for the third. The wafers were left at these pressures for 3 minutes. Next the chamber was evacuated for 30 seconds to 2 mbar (1.52 torr), then immediately backfilled with air back to ambient pressure. The films were then placed on a hotplate at 90° C. for 2 minutes, followed by an oven bake at 175° C. for 3 minutes, then another oven bake at 400° C. for 3 minutes. The wafers were then removed and after cooling were measured by Ellipsometry for thickness and refractive index. The results of the measurements are shown on the table below.

| Ammonia Dose Pressure (mbar) (torr) | Refractive Index | Thickness Å |
| --- | --- | --- |
| 270 (205.2) | 1.155 | 4250 |
| 506 (384.5) | 1.123 | 5200 |
| 855 (649.8) | 1.085 | 8050 |

EXAMPLE 4

This example illustrates a process wherein a precursor is spin deposited onto a silicon wafer, the wafer is then aged in a chamber for a given period and then dried. The aging process in the chamber is as follows. The chamber is evacuated, dosed with water vapor to a fixed pressure for a fixed amount of time, dosed with an amine vapor to a fixed pressure for a fixed amount of time, evacuated once again for a fixed time, then the pressure in the chamber is brought to ambient by backfilling with an inert gas. precursor was made by mixing, while stirring, 61 ml tetraethyoxysilane, 61 ml tetraethylene glycol, 4.87 ml deionized water, and 0.2 ml 1M nitric acid. This mixture was then refluxed while stirring continuously for 1.5 hours, then cooled. A portion of this precursor was then diluted 55% by weight with ethanol while stirring. To this dilute precursor was added 0.3 wt. percent of a solution consisting of 1 part Fluorad FC-430 surfactant (3M) to 9 parts ethanol. Approximately 1.5 ml of this diluted precursor was deposited onto a 4 inch silicon wafer on a spin chuck, and spun on at 2500 rpm for 10 seconds. The film was placed into an aging chamber, which was evacuated to 1 mbar (0.76 torr) in 30 seconds. Water vapor was dosed into the chamber to 14 mbar (10.64 torr) (from a reservoir of deionized water at 25° C.) and the wafer was left for 30 seconds at this pressure. Next n-butylamine vapor (from n-butylamine n a reservoir at 25° C. as dosed into the chamber to 16 mbar (12.16 torr) for 2 minutes. The chamber was evacuated for 30 seconds ~5 mbar (3.8 torr), then immediately backfilled with air to ambient pressure. The wafer was placed on a hotplate at 90° C. for 2 minutes, followed by an oven bake at 175° C. for 3 minutes, then another oven bake at 400° C. for 3 minutes. The wafer was removed and after cooling were measured by Ellipsometry for thickness and refractive index. The film had an average thickness of 3650 Å and a refractive index of 1.14.

EXAMPLE 5

This example illustrates a process wherein a precursor is spin deposited onto a silicon wafer, the wafer is then aged in a chamber for a given period, silylated, and then dried. The aging process in the chamber is as follows. The chamber is evacuated, water vapor at a fixed relative humidity is flowed through the chamber for a fixed amount of time, the chamber is then evacuated once again to different pressures, dosed with ammonia gas to a higher pressure (~200 mbar higher) (152 torr higher) for a fixed amount of time, evacuated once again for a fixed time, then the pressure in the chamber is brought to ambient by backfilling with an inert gas. A precursor was made by mixing, while stirring, 188.16 ml tetraethyoxysilane, 122 ml triethyleneglycol monomethyl ether, 15.1 ml deionized water, and 0.62 ml 1M nitric acid. This mixture was then refluxed while stirring continuously for 1.5 hours, then cooled. A portion of this precursor was then diluted 50% by weight with ethanol while stirring. Approximately 1.5 ml of this diluted precursor was deposited onto a 4 inch silicon wafer on a spin chuck, and spun on at 2500 rpm for 30 seconds. Three films were deposited in such a way. Each film was placed into an aging chamber, which was evacuated to 6 mbar (4.56 torr) in ~8 seconds. Compressed air was flowed through a bubbler and into the chamber at a rate of 2 l/min. for 2 minutes to produce a relative humidity of 75% within the chamber. The chamber was then evacuated to 206 mbar (156.56 torr), 393 mbar (298.68 torr), and 603 mbar (458.28 torr) for the three wafers respectively. Immediately thereafter the first wafer was dosed to 426 mbar (323.76 torr), 632 mbar (480.32 torr), and 814 mbar (618.64 torr) respectively, and after this dosing each film aged at this pressure for 2 minutes. After aging, the chamber was once again evacuated, this time to ~5 mbar (3.8 torr), and then backfilled with air to ambient pressure. The wafers were then removed from the aging chamber and placed back on the spin chuck and washed with 30 ml of a solution comprised of 15 ml acetone mixed with 15 ml of hexamethyldisilazane. The wafer was spun at 250 rpm for 15 seconds while the film was being washed, then the speed was increased to 1000 rpm for 15 more seconds, allowing the film to evaporate dry on the chuck. This solution was prepared at least one hour previous to use, but was never prepared more than 8 hours before use. After the film had been washed, the wafer was placed in a 170° C. oven for 3 minutes followed by a 320° C. oven for 3 minutes. The wafers were then removed and measured by Ellipsometry for thickness and refractive index. The results of the measurements are shown in the table below.

| Pressure After Water Dose (mbar) (torr) | Pressure after Ammonia Dose (mbar) (torr) | Index of Refraction | Thickness Å |
|---|---|---|---|
| 206 (156.56) | 426 (323.76) | 1.126 | 8500 |
| 393 (298.68) | 632 (480.32) | 1.126 | 8500 |
| 603 (458.28) | 814 (618.64) | 1.15 | 7500 |

EXAMPLE 6

This example illustrates a process wherein a precursor is spin deposited onto a silicon wafer, the wafer is then aged in a chamber for a given period, silylated, and then dried. The aging process in the chamber is as follows: water vapor at a fixed relative humidity is flowed through the chamber for a fixed amount of time, the chamber is then evacuated once again to a fixed pressure, dosed with ammonia gas to a different pressures for a fixed amount of time, evacuated once again for a fixed time, then the pressure in the chamber is brought to ambient by backfilling with an inert gas. A precursor was made by mixing, while stirring, 188.16 ml tetraethyoxysilane, 122 ml triethyleneglycol monomethyl ether, 15.1 ml deionized water, and 0.62 ml 1M nitric acid. This mixture was then refluxed while stirring continuously for 1.5 hours, then cooled. A portion of this precursor was then diluted 50% by weight with ethanol while stirring. Approximately 1.5 ml of this diluted precursor was deposited onto a 4 inch silicon wafer on a spin chuck, and spun on at 2500 rpm for 30 seconds. Three films were deposited in such a way. Each film was placed into an aging chamber through which compressed air was flowed through a bubbler and into the chamber at a rate of 2 l/min. for 2 minutes to produce a relative humidity of 75% within the chamber. After this the chamber was evacuated to 195 mbar (148.2 torr). Immediately following this evacuation, ammonia gas was dosed in to a pressure of 420 mbar (319.2 torr) for the first wafer, 615 mbar (476.4 torr) for the second, and 808 mbar (614.08 torr) for the third. After this dosing each film was aged at this pressure for 2 minutes. After aging, the chamber was once again evacuated, this time to ~5 mbar (3.8 torr), and then backfilled with air to ambient pressure. The wafers were then removed from the aging chamber and placed back on the spin chuck and washed with 30 ml of a solution comprised of 15 ml acetone mixed with 15 ml hexamethyldisilazane. The wafer was spun at 250 rpm for 15 second while the film was being washed, then the speed was increased to 1000 rpm for 15 more seconds, allowing the film to evaporate dry on the chuck. This solution was prepared at least one hour previous to use, but was never prepared more than 8 hours before use. After the film had been washed, the wafer was placed in a 170° C. oven for 3 minutes followed by a 320° C. oven for 3 minutes. The wafers were then removed and measured by Ellipsometry for thickness and refractive index. The results of the measurements are shown in the table below.

| Ammonia Dosing Pressure (mbar) (torr) | Refractive Index | Thickness Å |
|---|---|---|
| 420 (319.2) | 1.120 | 7950 |
| 615 (476.4) | 1.120 | 7950 |
| 808 (614.08) | 1.120 | 8000 |

EXAMPLE 7

This example illustrates a process wherein a precursor is spin deposited onto a silicon wafer, the wafer is then aged in a chamber for a given period, and dried. The aging process in the chamber is as follows. Water vapor at a fixed relative humidity is flowed through the chamber for a fixed amount of time, the chamber is then evacuated once again to different pressures, dosed with ammonia gas to a fixed pressure for a fixed amount of time, evacuated once again for a fixed time, then the pressure in the chamber is brought to ambient by backfilling with an inert gas. A precursor was made by mixing, while stirring, 188.16 ml tetraethyoxysilane, 122 ml triethyleneglycol monomethyl ether, 15.1 ml deionized water, and 0.62 ml 1M nitric acid. This mixture was then refluxed while stirring continuously for 1.5 hours, then cooled. A portion of this precursor was then diluted 50% by weight with ethanol while stirring. Approximately 1.5 ml of this diluted precursor was deposited onto a 4 inch silicon wafer on a spin chuck, and spun on at 2500 rpm for 30 seconds. Three films were deposited in such a way. Each film was placed into an aging chamber through which compressed air was flowed through a bubbler and into the chamber at a rate of 2 l/min. for 2 minutes to produce a relative humidity of 75% within the chamber. After this the chamber was evacuated to 120 mbar (91.2 torr), 361 mbar (274.36 torr), and 560 mbar (425.6 torr) for each wafer respectively. Immediately following this evacuation, ammonia gas was dosed in to a pressure of 800 mbar (608 torr) in each case, and the films were aged for two minutes. After aging, the chamber was once again evacuated, this time to ~5 mbar (3.8 torr), and then backfilled with air to ambient pressure. After this time the wafer was dried by placing it in a 170° C. oven for 3 minutes followed by a 320° C. oven for 3 minutes. After each wafer had been allowed to cool, the films were measured by Ellipsometry for thickness and refractive index. The results of the measurements are shown in the table below.

| H$_2$O Pressure Before NH$_3$ Dose (mbar) (torr) | Refractive Index | Thickness Å |
|---|---|---|
| 120 (91.2) | 1.237 | 3300 |
| 361 (274.36) | 1.210 | 3650 |
| 560 (425.6) | 1.220 | 3400 |

From the foregoing examples it can be seen that a nanoporous dielectric silicon containing composition can be produced by the post deposition steps of exposing a deposited film to water vapor in a sealed chamber evacuated to a pressure below atmospheric pressure followed by exposure to a base vapor.

What is claimed is:

1. A process for forming a nanoporous dielectric coating on a substrate which comprises
   (a) blending at least one alkoxysilane with a solvent composition and optional water, thus forming a mixture and causing a partial hydrolysis and partial condensation of the alkoxysilane;

(b) depositing the mixture onto a substrate while evaporating at least a portion of the solvent composition;

(c) placing the substrate in a sealed chamber and evacuating the chamber to a pressure below atmospheric pressure; then sequentially (d) exposing the substrate either to water vapor or to a base vapor, at a pressure below atmospheric pressure; then (e) exposing the substrate to water vapor if the substrate is exposed to a base vapor in step (d), or to a base vapor if the substrate is exposed to water vapor in step (d).

2. The process of claim 1 wherein the substrate is exposed to water vapor in step (d) and then to base vapor in step (e).

3. The process of claim 1 wherein the substrate is exposed to base vapor in step (d) and then to water vapor in step (e).

4. The process of claim 1 wherein step (e) is conducted at a pressure below atmospheric pressure.

5. The process of claim 1 wherein step (e) is conducted at atmospheric pressure.

6. The process of claim 1 wherein step (e) is conducted at a pressure above atmospheric pressure.

7. The process of claim 1 wherein the solvent composition comprises a relatively high volatility solvent and a relatively low volatility solvent.

8. The process of claim 1 wherein the solvent composition comprises a relatively high volatility solvent and a relatively low volatility solvent; at least a portion of the relatively high volatility solvent is evaporated in step (b) and at least a portion of the relatively low volatility solvent is evaporated in a subsequent step (f).

9. The process of claim 8 wherein the relatively high volatility solvent composition has a boiling point of about 120° C. or less and the relatively low volatility solvent composition has a boiling point of about 175° C. or more.

10. The process of claim 8 wherein the relatively high volatility solvent composition comprises one or more components selected form the group consisting of methanol, ethanol, n-propanol, isopropanol, n-butanol and mixtures thereof and wherein the relatively low volatility solvent composition comprises an alcohol or a polyol.

11. The process of claim 1 wherein step (a) comprises blending water in the mixture.

12. The process of claim 11 wherein step (a) further comprises blending a catalytic amount of an acid in the mixture.

13. The process of claim 1 wherein the alkoxysilane comprises one or more components selected from the group consisting of tetraethoxysilane and tetramethoxysilane.

14. The process of claim 1 wherein the base vapor comprises one or more components selected from the group consisting of ammonia, amines and mixtures thereof.

15. The process of claim 1 wherein the mole ratio of water vapor to base vapor ranges from about 1:3 to about 1:100.

16. The process of claim 1 wherein the base vapor has a $pK_b$ of from about less than 0 to about 9.

17. The process of claim 1 wherein the alkoxysilane has the formula:

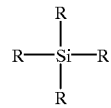

wherein at least 2 of the R groups are independently $C_1$ to $C_4$ alkoxy groups and the balance, if any, are independently selected from the group consisting of hydrogen, alkyl, phenyl, halogen, substituted phenyl.

18. The process of claim 17 wherein each R is methoxy, ethoxy or propoxy.

19. The process of claim 1 wherein the nanoporous dielectric coating has a dielectric constant of from about 1.1 to about 3.5.

20. The process of claim 1 wherein the substrate comprises a semiconductor material.

21. The process of claim 1 wherein the substrate comprises silicon or gallium arsenide.

* * * * *